(12) United States Patent
Le-Gall et al.

(10) Patent No.: US 7,941,738 B2
(45) Date of Patent: May 10, 2011

(54) METHOD FOR CHARACTERIZING A BIT DETECTION EVENT

(75) Inventors: Hervé Le-Gall, St Martin D'Uriage (FR); Paul Armagnat, Seyssinet (FR); Jean-Christophe Pont, Saint Ismier (FR)

(73) Assignee: STMicroelectronics S.A., Montrouge (FR)

( * ) Notice: Subject to any disclaimer, the term of this patent is extended or adjusted under 35 U.S.C. 154(b) by 1096 days.

(21) Appl. No.: 11/716,396

(22) Filed: Mar. 9, 2007

(65) Prior Publication Data
US 2007/0226595 A1    Sep. 27, 2007

(30) Foreign Application Priority Data

Mar. 17, 2006 (FR) ..................................... 06 02386

(51) Int. Cl.
*G06K 5/00* (2006.01)
(52) U.S. Cl. .................... 714/818; 714/776; 714/785
(58) Field of Classification Search .................. 714/818, 714/776, 785, 752
See application file for complete search history.

(56) References Cited

U.S. PATENT DOCUMENTS

| | | | |
|---|---|---|---|
| 5,220,581 A | 6/1993 | Ferraiolo et al. | |
| 5,371,766 A | 12/1994 | Gersbach et al. | |
| 6,701,140 B1 | 3/2004 | Stine | |
| 2005/0025274 A1 | 2/2005 | Rivoir | |

OTHER PUBLICATIONS

Preliminary French Search Report, FR 06 02386, dated Dec. 8, 2006.

*Primary Examiner* — Fritz Alphonse
(74) *Attorney, Agent, or Firm* — Gardere Wynne Sewell LLP

(57) ABSTRACT

A bit detection event within a read period is characterized by sub-dividing each read period into elementary time intervals. Certain ones of the elementary intervals are selected to for a window and a counting operation for a number of bits detected during the intervals within the window is performed. The elementary time intervals are defined by a difference between a frequency corresponding to the read period and a bit detection timing frequency. The counting result for the intervals in the window over several consecutive read periods is statistically processed. A reduction of an integrated electronic circuit test duration results from limiting the counting operations performed to the selected elementary time intervals.

25 Claims, 3 Drawing Sheets

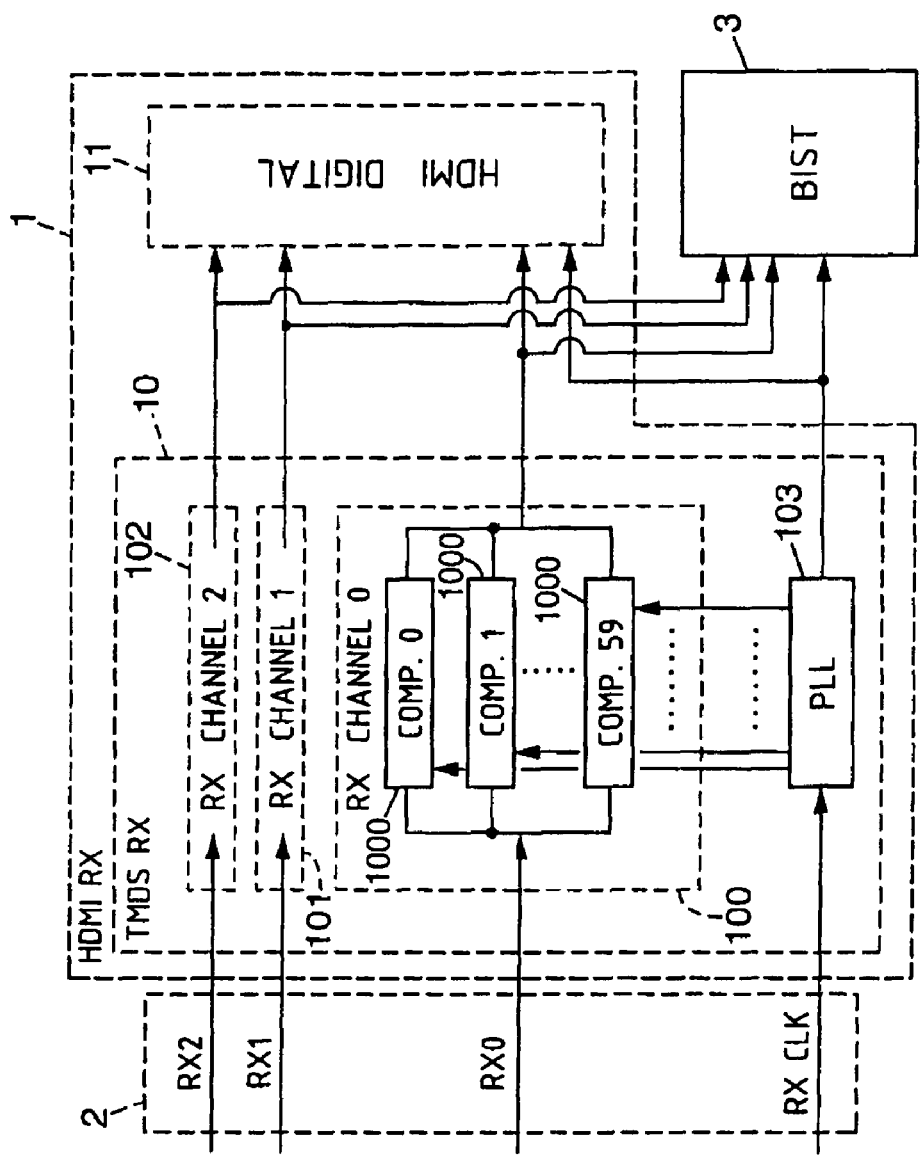
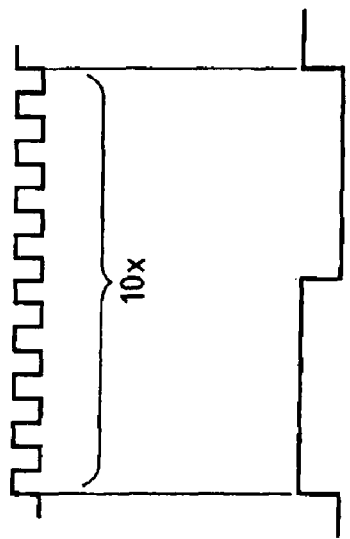
FIG. 1

METHOD FOR CHARACTERIZING A BIT DETECTION EVENT

PRIORITY CLAIM

The present application claims priority from French Patent Application No. 06 02386 filed Mar. 17, 2006, the disclosure of which is hereby incorporated by reference.

BACKGROUND OF THE INVENTION

1. Technical Field of the Invention

The present invention relates to a method for characterizing the moment at which a bit is detected within an electronic circuit. It also relates to a circuit that incorporates a binary data receiver together with a test module for this receiver.

2. Description of Related Art

When an integrated electronic circuit that incorporates a binary data receiver is fabricated, the operation of the latter needs to be verified for each circuit unit produced. In particular, it needs to be verified that the data transmitted to the receiver is correctly detected. This is notably the case when the data is received according to the HDMI (High-Definition Multimedia Interface) standard.

Now, the moment of detection of a bit received can vary within a read period of the bit, notably because of external interference. Such variations are capable of causing a bit detection error. For this reason, the statistical distribution of the detection times within successive read periods must be determined during circuit operational tests.

In order to perform these tests, a specific module is added to the integrated electronic circuit, which is often called BIST (Built-In Self-Test) module. Although not usable during the circuit operation according to the function for which the circuit is designed, this module nevertheless results in a cost increase for the circuit. It is therefore advantageous to design a simple BIST module, and notably a BIST module that occupies as small an electronic circuit substrate surface area as possible.

The test of each circuit unit produced is carried out using a specific monitoring instrument, called a tester, whose price varies considerably depending on the technical requirements demanded of the tester. For example, a tester that operates at a rate of 320 Mbit/s has a much lower cost than a tester which operates at a rate of 1.6 Gbit/s. In fact, the demands on the performance of the tester depend on the functions performed within the BIST module, which is why a compromise is sought between a simplified BIST module and the necessity for using a costly tester.

In order to determine the statistical distribution of bit detection times situated within successive read periods, each read period needs to be sub-divided in the same manner into elementary time intervals, and the number of times where a bit is detected within each sub-division interval needs to be counted. However, a system rate that corresponds to the elementary intervals of time from the sub-division will be high. In order to avoid using a tester that operates at such a high rate, a known solution is to create these elementary intervals by using two frequencies separated by a small difference, for timing the read periods and for triggering the bit detection, respectively. Thus, the tester generates a bit detection trigger signal at a first frequency, and generates a binary signal at a second, slightly different, frequency. The signal at the second frequency is synthesized within the tester starting from the signal at the first frequency, with a high enough precision to define the elementary time intervals for the read period sub-division by the progressive shift which occurs between the two signals. The signal at the second frequency corresponds to the bits detected by the circuit receiver during the test.

However, counting the number of times where a bit is detected within each sub-division elementary time interval requires that the bit be transmitted a given number of times, for example 256 times, whereas the detection is sought within a given elementary interval. The same operation must then be repeated for each elementary interval. The result of this is a long test duration, which contributes to an increase in the production cost of each electronic circuit unit produced.

There is a need in the art to be able to characterize the statistical distribution of the bit detection times, while achieving an improved compromise between a simplified BIST module, on the one hand, a tester that is not too costly, on the other, and furthermore providing a test of limited duration.

SUMMARY OF THE INVENTION

To this end, a method is presented for characterizing a bit detection event within a read period of the bit, wherein several read periods are sub-divided in the same fashion into a fixed number of elementary time intervals. These elementary intervals are defined by a difference between a frequency corresponding to the read period and a frequency according to which a bit detection is timed. In addition, the method comprises the following steps:

/a/ identifying a first elementary time interval for which a probability that a detection event occurs within this first interval is non-zero;

/b/ starting from this first elementary interval, selecting a time window comprising several successive elementary intervals, the window being shorter than a read period and containing a large proportion of the detection events;

/c/ repeating the bit several times in an identical manner within the corresponding read periods, and counting the number of times where a bit is detected during each elementary time interval situated within the window, wherein no counting of detected bit is carried out for an elementary time interval which is situated outside said window.

The counting operations carried out for the elementary time intervals that are situated within the window then characterize a part of the statistical distribution of the bit detection events within the read periods.

Thus, the number of times where a bit is detected within each sub-division elementary interval of the read periods is only counted for those ones of the elementary intervals which are situated within the selected time window. Given that different counters are required for all the elementary intervals for which counting operations are carried out simultaneously, the limitation of the counting operations carried out to the intervals of the window allows the number of counters required to be reduced.

In addition, when counting operations are carried out at step /c/ simultaneously for several intervals of the window, the test duration required is substantially reduced in proportion to the ratio of the number of elementary intervals included within the window, with respect to counting operations performed one by one.

Furthermore, limiting the characterization of the statistical distribution of the detection events to within a shorter time window than the read periods does not lead to any significant loss of information concerning this statistical distribution. Indeed, thanks to steps /a/ and /b/ which are executed first of all, the window is selected such that a large proportion of the detection events are situated within this window. In other words, the detection events situated outside of the window are not taken into account in the characterization that is carried out, however such events which are limited in proportion do not significantly contribute to the global statistical distribution of the detection events.

Furthermore, one advantage of a characterization method results from the fact that the elementary time intervals which are used to determine the statistical distribution of the detection events are defined by a difference between the frequency corresponding to the bit read period and the frequency according to which the bit detection is timed. The method can then be implemented by using an electronic circuit tester that has a rate substantially corresponding to the read period of the bits. The cost of such a tester is reduced relative to that of a tester that would have a rate corresponding to the elementary time intervals.

Finally, the bit characterization method does not require the circuits tested to be fitted with on-board test, or BIST, modules which are complex. In particular, the test module of a circuit tested in this manner can comprise only logic components of lower complexity. The additional cost of each circuit unit produced that is generated by the test module is then limited.

An embodiment of a method can also comprise an evaluation of a mean value or of a standard deviation of the detection time within each read period. Other quantities characteristic of the statistical distribution of the detection time can also be evaluated. Such evaluations are performed based on the numbers of times where a bit is detected during each elementary time interval situated within the window.

According to a first enhancement, step /c/ is repeated using successive windows selected in order to perform a scanning of a part of a read period. A larger part of the statistical distribution of the bit detection events within the read periods can thus be obtained, without a significant increase in the complexity of the test module of the circuit under test being required. Advantageously, a last elementary time interval from the part of a read period corresponding to the scan is selected such that the probability that a detection event occurs within this last interval is non-zero. In addition, the last time interval is also selected such that a large proportion of the detection events occur between first and last intervals within the corresponding read periods.

According to a second enhancement, at step /c/, a different counter is associated with each elementary interval situated within the window and, at each read period, the assignment of the counters to the intervals is modified as a function of the difference between the frequency corresponding to the read period and the detection frequency. The counting operations carried out for all the elementary intervals situated within the same window can then be performed simultaneously or, in other words, in parallel. The time required to characterize the statistical distribution of the bit detection times is then reduced.

In another embodiment, a test procedure for an integrated electronic circuit incorporating a binary data receiver comprises a characterization of a bit detection event such as that described hereinabove.

An embodiment also relates to an integrated electronic circuit incorporating a receiver for binary data transmitted via at least one bit line, and a module for testing this receiver, the module being designed to implement a method such as is described hereinabove for characterizing a detection event for a bit transmitted via the bit line.

In particular, the receiver can be designed according to the HDMI standard. It can comprise a phase-locked loop and, for each bit line, at least one comparator connected at input to the bit line. The phase-locked loop is thus designed to deliver a trigger signal to the comparator at each period of a clock signal, at a given moment during the latter.

In another embodiment, a method for characterizing bit detection within a read period, comprises: sub-dividing several consecutive read periods, in each of which a test square-wave signal is received, the test square-wave signal defining a length of the read periods, in a same fashion into a fixed number of elementary time intervals defined by a difference between a frequency of the read period and a frequency according to which a bit edge detection is timed; identifying a first elementary time interval in the read period which is earlier than an edge transition of the received test square-wave signal; starting from said first elementary time interval, selecting a time window comprising several successive elementary time intervals, said time window being shorter than the read period; over successive read periods, counting a number of times where a certain bit value is detected during each elementary time interval situated within the time window, said counting performed only for elementary time intervals within the time window; and generating an output which characterizes a statistical distribution of the bit value detections within the read period based on the number counted in each elementary time interval.

BRIEF DESCRIPTION OF THE DRAWINGS

Other specific features and advantages will become apparent in the following description of a non-limiting exemplary embodiment, which makes reference to the appended drawings, in which:

FIG. 1 illustrates the architecture of an integrated electronic circuit for which a characterization method can be used;

DETAILED DESCRIPTION OF THE DRAWINGS

Figure 2:
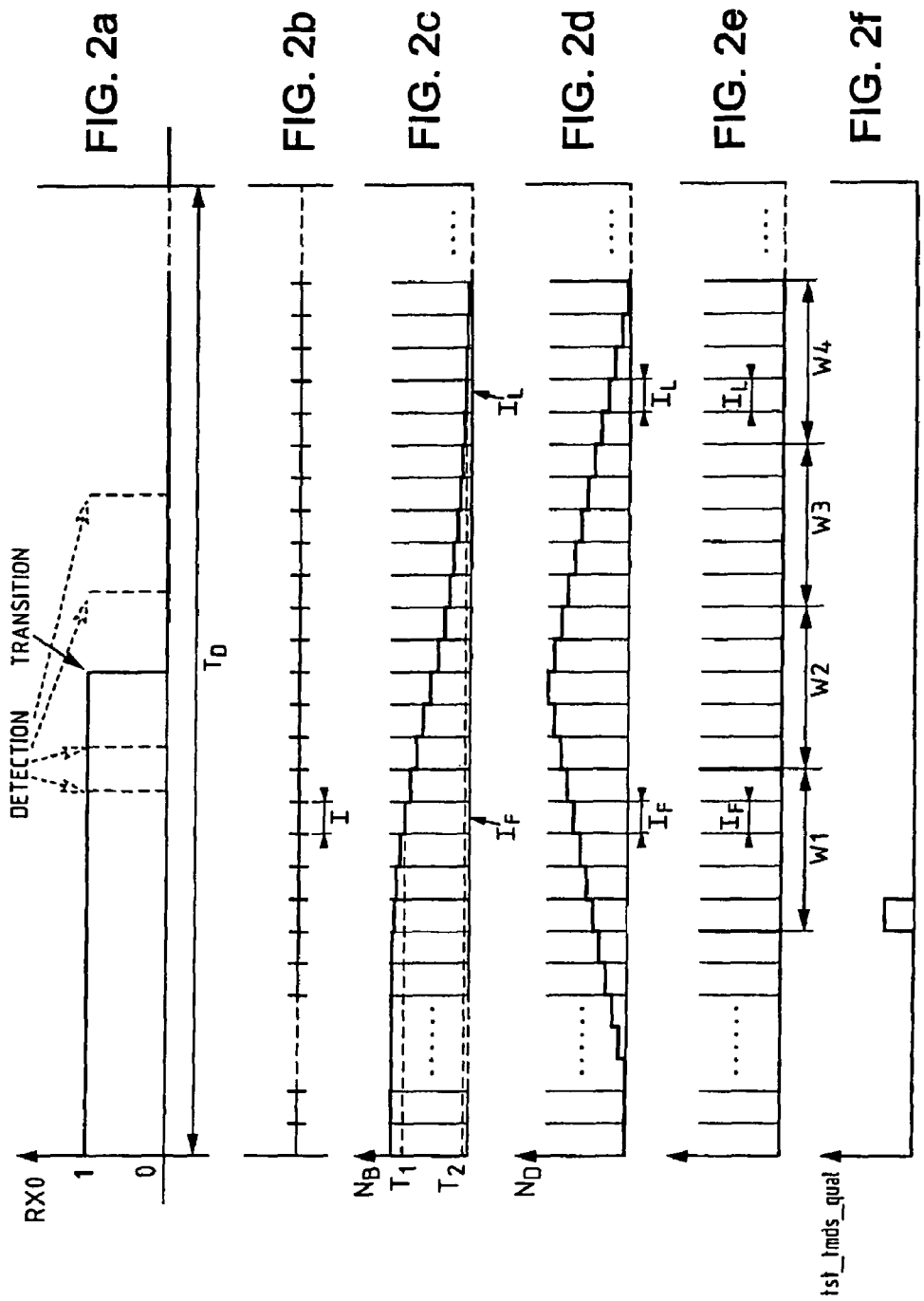
FIGS. 2a-2f, which are intended to be cross-referenced to one another, illustrate the data acquisition principle for characterization of a detection event, which is used in a method.

According to FIG. 1, an integrated electronic circuit incorporates a receiver 1 for binary data transmitted via a connection 2, and a module 3 for testing the receiver 1. The module 3 is usually referred to as a BIST module. The receiver 1 and the BIST module 3 are formed on the same integrated electronic circuit substrate.

The receiver 1 can be of the HDMI type, and is denoted as HDMI RX in FIG. 1. In a known manner, it comprises a TMDS receiver stage, referenced 10 and denoted as TMDS RX, and a module 11 for digital processing of the received data, denoted as HDMI Digital. The receiver stage 10 itself comprises several receiver channels, for example three channels 100, 101, 102, respectively denoted as RX Channel 0, RX Channel 1 and RX Channel 2, and a phase-locked loop 103, denoted as PLL. The three channels 100-102 are respectively connected at their inputs to three bit lines denoted as RX 0, RX 1 and RX 2, and at their outputs to the module 11. The phase-locked loop 103 is connected at its input to a clock line, denoted as RX CLK, and at its output to the module 11. The lines RX 0, RX 1, RX 2 and RX CLK form the connection 2 via which the binary data is transmitted to the receiver 1.

Each receiver channel 100-102 comprises sixty comparators, denoted as COMP. 0, COMP. 1, . . . , COMP 59 and referenced 1000. The three channels 100-102 are identical, so that the invention is described in the following with reference to a single channel, for example the channel 100 (RX Channel 0).

The phase-locked loop 103 is designed to produce sixty trigger signals (or 'tap') distributed within each period of the clock signal received by the line RX CLK. Each trigger signal is produced at a given time within the clock signal period. The 60 trigger signals are respectively delivered to the comparators 1000 of each receiver channel 100-102 via dedicated connections. The reception by a comparator 1000 of a trigger signal causes the detection of a bit transmitted via the corresponding bit line. The moment of detection of the bit within a read period of the latter is therefore determined by the trigger signal which is transmitted to the comparator selected for reading this bit, for the receiver channel under consideration.

The BIST module 3 is connected at its input to the respective outputs of the three receiver channels 100-102, and also to an output of the phase-locked loop 103. It comprises three selection and counting assemblies that are respectively associated with the three bit lines and associated receiver channels 100-102. Each assembly is configured for characterizing the moment of detection of a bit transmitted via the corresponding bit line. An embodiment of the BIST module 3 will be described later, in relation to FIG. 3.

According to the TMDS standard, the period of the clock signal which is transmitted via the line RX CLK is equal to ten times the transmission period of a bit on one of the lines RX 0, RX 1 or RX 2, during normal operation of the circuit. This is shown in FIG. 1.

In order to characterize the moments of detection of a bit by one of the channels 100-102, a tester (not shown) external to the circuit is connected to the circuit. This tester transmits a clock signal of frequency $f_C$=165.000 MHz on the line RX CLK, and a square-wave data signal of frequency $f_D$=165.275 MHz on the bus line of the channel under test, for example, of the channel 100. This data signal defines successive read periods, during each of which a bit can be detected. The duration of the read periods is $T_D$=1/$f_D$=6.051 ns (nanoseconds). Since the period associated with $f_C$ is 6.061 ns, an additional delay of 10 ps (picoseconds) occurs between the clock signal and the data signal, at each new read period.

In a known manner, the clock and data signals, at the frequencies $f_C$ and $f_D$ respectively, periodically find themselves in the same relative phase state, according to a beat frequency of $f_B$=275 kHz. The delay between the clock signal and the data signal that appears at each new read period then defines a fixed division of the read periods into elementary time intervals, when a succession of read periods corresponding to the duration of a beat between the two frequencies $f_C$ and $f_D$ is considered. Each elementary time interval therefore has a duration equal to 10 ps. The beat period $T_B$=1/$f_B$=3.6 μs corresponds to the duration of a scanning of the read period with a scan period that corresponds to the elementary time intervals defined by the difference between the frequencies $f_C$ and $f_D$.

FIG. 2a illustrates a bit of the data signal RX 0 within a read period $T_D$. A transition of this bit, for example a falling edge, occurs at a moment that is precisely defined by the tester within the read period $T_D$. The moment of the detection of the bit, which is controlled by the phase-locked loop 103, can vary over the period $T_D$ in such a manner that the read result may be 1 or 0, depending on whether the effective read time (specified by the tap) falls before or after the moment of transition of the bit. The data signal which is transmitted by the tester over the bit line RX 0 has a high enough precision in order to allow the statistical distribution of the detection times to be characterized. Thanks to the square-wave shape of this signal, the bit is repeated in an identical manner in the successive read periods.

FIG. 2b shows the division of the read period $T_D$ into elementary time intervals, denoted as I. For the aforementioned respective durations of the period $T_D$ and of each interval I, each read period $T_D$ is divided up into 605 elementary intervals I.

FIG. 2c is a histogram of the number of times a bit could be detected for each interval I, if counting operations were carried out for all the intervals I over an acquisition time corresponding to a given number of beat periods $T_B$.

FIG. 2d is a histogram deduced from that in FIG. 2c. It shows the differences between the numbers counted for two successive intervals I. Hence, the histogram in FIG. 2d characterizes the statistical distribution of the detection times over the read period $T_D$. The number thus obtained of detection events that have occurred in each interval I is denoted as $N_D$.

A method for the acquisition of data relating to the distribution of the bit detection times within the read periods is now described.

During a first step, a first elementary time interval of the sub-division of each read period is sought, for which a bit detection event can occur with a significant probability. For this purpose, an acquisition is carried out over several beat periods $T_B$, during which the bit is repeated in an identical manner at each read period $T_D$. The number of times where a bit is detected within a previously selected elementary time interval is then counted. This number is denoted as $N_B$ in FIG. 2c. If the BIST module 3 comprises several counters, for example five counters, such counting operations can be carried in parallel for five successive elementary time intervals I.

According to a preferred method for seeking an elementary interval that contains at least one detection event, the number $N_B$ of times where a bit is detected within the previously selected interval is counted, and the number obtained is compared with a first threshold, denoted as $T_1$ in FIG. 2c. A number $N_B$ which is greater than the threshold $T_1$ signifies that the elementary interval is situated too early within the read periods $T_D$. Conversely, a number $N_B$ which is less than the threshold $T_1$ signifies that the elementary interval is situated too late within the read periods $T_D$. Five numbers $N_B$ obtained during the same acquisition period for five elementary intervals I considered simultaneously are compared with the threshold $T_1$. If one of them is sufficiently close to this threshold, the corresponding interval is selected as first interval, or starting point, of the scan of a part of the read periods $T_D$. If the numbers $N_B$ obtained for the five intervals considered simultaneously are far away from the threshold $T_1$, then the first step is repeated for a new series of five elementary time intervals. The numbers $N_B$ obtained for the first series of five intervals are advantageously used for choosing the five intervals of the new series. At the end of the first step of the process, a first interval for the sub-division of each read period $T_D$ is therefore selected. This is denoted as $I_F$ in FIGS. 2c-2e.

Advantageously, a last elementary interval of the read period part that corresponds to the scanning of the read periods $T_D$ can also be selected. This last interval, denoted as $I_L$ in FIGS. 2c-2e, can also correspond to the probability of a detection event occurring within this interval being non-zero. It can be selected in a similar manner to the first interval $I_F$. In particular, the last interval $I_L$ can also be selected by repeating the bit several times in an identical manner within corresponding read periods during several beat periods $T_B$, counting the number $N_B$ of times where a bit is detected within this interval, and comparing the number obtained with a second threshold $T_2$.

The thresholds $T_1$ and $T_2$ can be stored in a ROM memory element of the BIST module 3, for example in the form of an 8-bit word. Alternatively, they can be programmed by means of the tester and transmitted to the BIST module 3 via dedicated connections (see FIG. 3). By way of example, the thresholds $T_1$ and $T_2$ can be respectively equal to 10% and 90% of the number of beat periods $T_B$ corresponding to the acquisition time.

It will be understood that, in an equivalent manner, the first elementary interval of time $I_F$ can be sought by considering the rising-edge bit transitions. The same is true for the last elementary interval $I_L$.

During a second step of the process, a time window comprising several successive intervals I is selected, in order to be applied to each read period $T_D$. The interval $I_F$ and/or the interval $I_L$ is (are) used to select the window. According to one particular mode of operation, the intervals $I_F$ and $I_L$ correspond to the limits of the window. According to another mode of operation, the window is selected starting from one of the intervals $I_F$ and $I_L$, and has a fixed length. According to yet another mode of operation, the window can be situated with respect to the intervals $I_F$ and $I_L$ according to pre-established rules, without these intervals corresponding to either the beginning or the end of the window.

During a third step of the process, a scan of the time intervals I included within the window is carried out, in order to determine the number of times where a bit is detected during each of these intervals. For this purpose, a different detector and counter are associated with each elementary interval I situated within the window and, at each new read period $T_D$, the assignment of the counters to the detectors is modified as a function of the difference between the frequencies $f_C$ and $f_D$.

According to a preferred embodiment, the scanning of a part of the read period $T_D$ is carried out using several successive windows selected using the elementary intervals $I_F$ and $I_L$. By way of example, four successive windows, denoted as W1-W4 in FIG. 2e, may be selected in order to perform the scan of the read period part. Each window W1, ... , W4 can comprise several elementary intervals I, for example five intervals, depending on the number of counters that the BIST module 3 comprises for each receiver channel. In an optimized manner, the number of intervals of each window, for which the numbers of bits detected are counted simultaneously, is equal to the number of counters of the BIST module 3 for this channel.

For each of the windows W1, ... , W4, the acquisition time, for counting the numbers of bits detected within each interval I of this window, can be equal to 256/n periods $T_B$, where n denotes the number of intervals I within each window. Given that at each period $T_B$, the bit is repeated usefully for n read periods $T_D$, 256 repetitions of the bit correspond to detections that are useful for characterizing the distribution of the detection events.

The third step for counting the bits detected is repeated for each of the four windows W1-W4.

Once the histogram in FIG. 2d has been obtained in the period part $T_D$ which corresponds to the four windows W1-W4, several statistical quantities can be evaluated from the numbers $N_D$. Amongst these quantities the mean value and the standard deviation of the moment of detection can be calculated, in a manner known to those skilled in the art.

When the detection event characterization histograms are recorded for each of the comparators 1000 of a given receiver channel, it is then possible to characterize the distribution of the mean values of the detection times associated with these comparators within a read period $T_D$. Such a characterization of the channel is usually referred to as 'linearity' of the channel detection events.

According to an improvement, several bit detection event characterizations may be performed simultaneously, respectively for several receiver channels that are arranged in parallel within the integrated electronic circuit, using same signals for triggering bit detection for these receiver channels. For the circuit of FIG. 1, the bit detection events for channels 100, 101 and 102 may be thus characterized simultaneously. To this end, the phase-locked loop 103 is connected to the comparators 1000 of the bit lines with a parallel association with respect to these bit lines. The trigger signals are then delivered simultaneously to the comparators associated in parallel. The BIST 3 is also adapted for characterizing simultaneously the bit detection events for the bits that are transmitted respectively via the bit lines RX0, RX1 and RX2.

Figure 3:
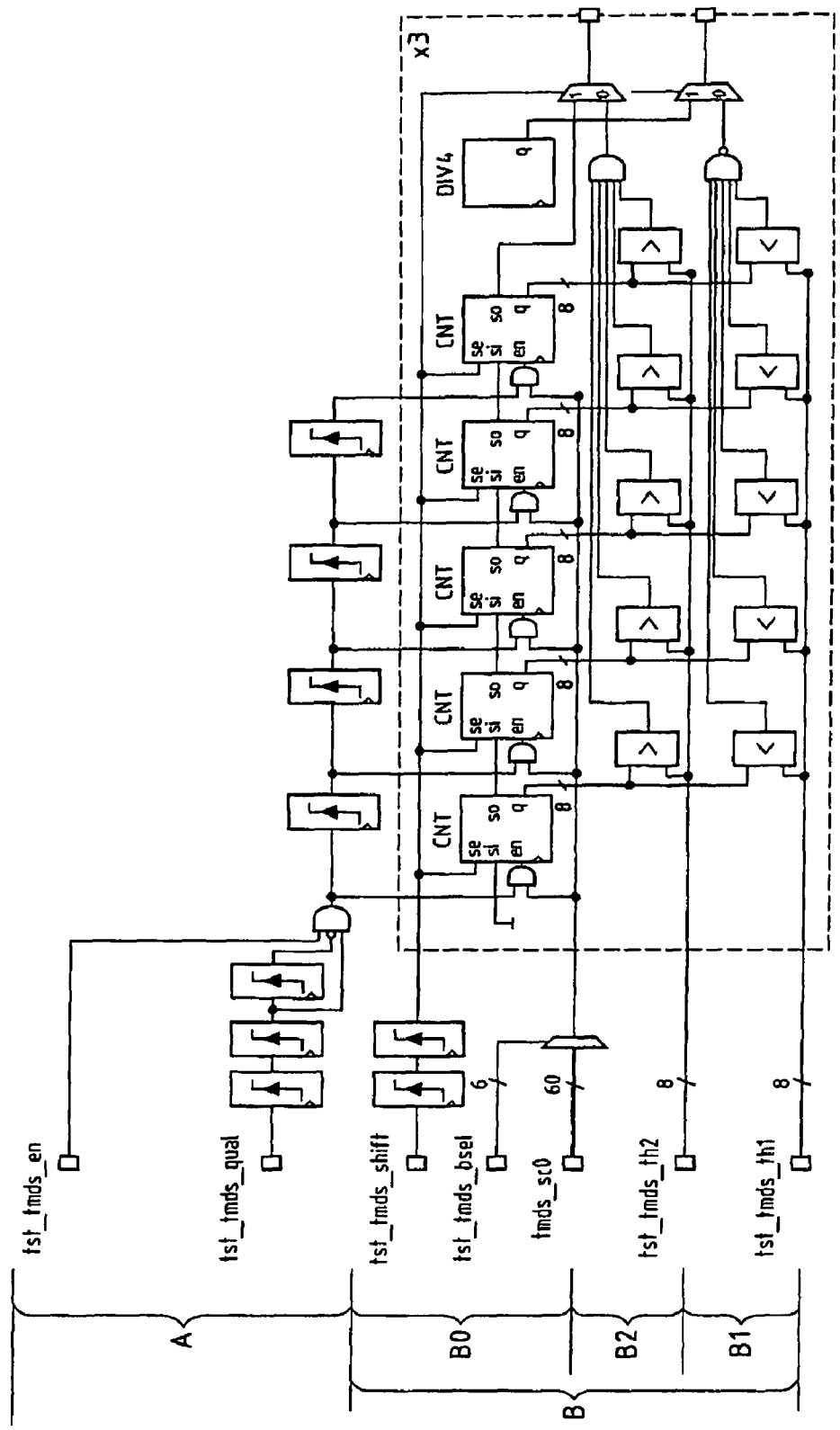
FIG. 3 illustrates an architecture of a BIST module designed for implementing a method.

FIG. 3 shows a possible architecture for the BIST module 3. This comprises a control part, denoted as A, and three selection and counting assemblies, denoted as B and respectively associated with the three bit lines RX 0, RX 1 and RX 2. Each of the assemblies B comprises a series of five counters, denoted as B0, and two series of comparators, B1 and B2 respectively. The comparator series B1 and B2 allow the results of the counters of the series B0 to be compared with the thresholds $T_1$ and $T_2$, respectively, in order to select the intervals $I_F$ and $I_L$. A conventional manner of representing logic components has been adopted for FIG. 3, which is known to those skilled in the art. The input signals indicated are the following:

tmds_sc0: a square-wave signal transmitted by the tester onto each bit line RX 0, RX 1 and RX 2;

tst_tmds_bsel: a signal for selecting one of the comparators 1000 for the test in progress, transmitted by the tester;

tst_tmds_th1: a threshold $T_1$ programmed by means of the tester;

tst_tmds_th2: a threshold $T_2$ programmed by means of the tester;

tst_tmds_shift: a clock signal RX CLK transmitted by the phase-locked loop 103;

tst_tmds_qual: a counting trigger signal for the elementary intervals comprised within the scanning window. This signal is shown in FIG. 2f for the window W1; and tst_tmds_en: a signal for activating the test of the receiver 10.

It will be understood that the architecture illustrated in FIG. 3 is only given by way of example, and that equivalent architectures may be conceived for the implementation of the method. Finally, modifications may also be introduced into the exemplary embodiment that has been described in detail, while at the same time retaining at least a part of the following advantages, namely:

the compatibility of the method for characterizing the bit detection event with the use of a low-cost tester;

the compatibility of the method with a simple BIST that does not lead to a significant increase in the production cost of each unit of the electronic circuit produced; and a duration for the tests of each circuit unit that is limited.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A method for characterizing a bit detection event within a read period of said bit wherein several read periods are sub-divided in a same fashion into a fixed number of elementary time intervals defined by a difference between a frequency corresponding to the read period and a frequency according to which a bit detection is timed, the method comprising:
/a/ identifying a first elementary time interval for which a probability that a bit detection event occurs within said first interval is non-zero;
/b/ starting from said first elementary time interval, selecting by a selection circuit a time window comprising several successive elementary time intervals, said time window being shorter than a read period and containing a large proportion of the detection events;
/c/ repeating the bit several times in an identical fashion within corresponding read periods, and counting by a counting circuit the number of times where a bit is detected during each elementary time interval situated within the window, wherein no counting of detected bit is carried out for an elementary time interval situated outside said window, and
generating an output from results of the counting operations carried out for the elementary intervals situated within the window which characterize a part of a statistical distribution of the bit detection events within the read periods.

2. The method according to claim 1, wherein the first elementary time interval is selected by repeating the bit several times in an identical fashion within the corresponding read periods, by counting the number of times where a bit is detected within said first interval and by comparing the number obtained to a first threshold.

3. The method according to claim 1, wherein /c/ is repeated using successive time windows selected in order to perform a scan of a part of a read period.

4. The method according to claim 3, wherein a last elementary time interval from the part of the read period corresponding to the scan is selected such that a probability that a detection event occurs within said last elementary time interval is non-zero, a large proportion of the detection events occurring between said first and last elementary time intervals within the corresponding read periods.

5. The method according to claim 4, wherein the last elementary interval is selected by repeating the bit several times in an identical fashion within corresponding read periods, by counting the number of times where a bit is detected within said last elementary time interval and by comparing the number obtained to a second threshold.

6. The method according to claim 1, further comprising evaluating a mean value of the detection time within each read period.

7. The method according to claim 1, further comprising evaluating a standard deviation of the detection time within each read period.

8. The method according to claim 1, wherein, at /c/, a different counter is associated with each elementary time interval situated within the time window, and wherein, at each read period, the assignment of the counters to the intervals is modified as a function of the difference between the frequency corresponding to the read period and the detection frequency.

9. The method according to claim 1, wherein each time window comprises five elementary time intervals.

10. The method according to claim 1, wherein the frequency corresponding to the read period and the detection frequency are 165.275 MHz and 165.000 MHz, respectively.

11. The method according to claim 1, wherein at /c/ the bit is repeated at least 256 times.

12. The method according to claim 1, wherein /c/ is repeated four times using four successive time windows selected in order to perform a scan of a part of the read period.

13. A test method for an integrated electronic circuit incorporating a binary data receiver comprising:
characterizing a bit detection event within a read period of a bit, wherein several read periods are sub-divided in a same fashion into a fixed number of elementary time intervals defined by a difference between a frequency corresponding to the read period and a frequency according to which a bit detection is timed, wherein characterizing comprises:
/a/ identifying a first elementary time interval for which a probability that a bit detection event occurs within said first interval is non-zero;
/b/ starting from said first elementary time interval, selecting a time window comprising several successive elementary time intervals, said time window being shorter than a read period and containing a large proportion of the detection events;
/c/ repeating the bit several times in an identical fashion within corresponding read periods, and counting the number of times where a bit is detected during each elementary time interval situated within the window, wherein no counting of detected bit is carried out for an elementary time interval situated outside said window, and
generating an output from results of the counting operations carried out for the elementary intervals situated within the window to characterize a part of a statistical distribution of the bit detection events within the read periods.

14. The test method as claimed in claim 13 wherein the binary data receiver is an HDMI receiver.

15. The test method as claimed in claim 13, wherein several bit detection event characterizations are performed simultaneously, respectively for several receiver channels arranged in parallel within said integrated electronic circuit, using same signals for triggering bit detection for said receiver channels.

16. An integrated electronic circuit, comprising:
a receiver adapted to receive binary data transmitted via at least one bit line; and
a test module adapted to test said receiver, the module being designed to implement a method for characterizing a bit detection event, for a bit transmitted via said line, within a read period of said bit, wherein several read periods are sub-divided in a same fashion into a fixed number of elementary time intervals defined by a difference between a frequency corresponding to the read period and a frequency according to which a bit detection is timed,
wherein the method for characterizing comprises:
/a/ identifying a first elementary time interval for which a probability that a bit detection event occurs within said first interval is non-zero;
/b/ starting from said first elementary time interval, selecting a time window comprising several successive elementary time intervals, said time window being shorter than a read period and containing a large proportion of the detection events;

/c/ repeating the bit several times in an identical fashion within corresponding read periods, and counting the number of times where a bit is detected during each elementary time interval situated within the window, wherein no counting of detected bit is carried out for an elementary time interval situated outside said window, and generating an output from the counting operations carried out for the elementary intervals situated within the window which characterizes a part of a statistical distribution of the bit detection events within the read periods.

17. The circuit as claimed in claim 16, wherein the receiver is an HDMI receiver.

18. The circuit according to claim 16, wherein the receiver comprises a three-bit-line bus, and wherein the test module comprises three selection and counting assemblies respectively associated with the three bit lines, each selection and counting assembly being configured to implement /a/, /b/ and /c/ of the method.

19. The circuit according to claim 18, wherein the receiver comprises a phase-locked loop and, for each bit line, at least one comparator connected at input to the bit line, the phase-locked loop adapted to deliver a trigger signal to the comparator at each period of a clock signal, at a given moment within said period of the clock signal.

20. The circuit according to claim 19, wherein the receiver comprises, for each bit line, sixty comparators connected at input to the bit line, said phase-locked loop being configured to deliver respective trigger signals to the comparators, distributed within the period of the clock signal.

21. The circuit according to claim 18, wherein the phase-locked loop is connected to the comparators of several bit lines, with a parallel association with respect to said bit lines, and adapted to deliver trigger signals simultaneously to the comparators associated in parallel, and wherein the test module is adapted to characterize simultaneously the bit detection events for bits transmitted respectively via said bit lines.

22. A method for characterizing bit detection within a read period using a digital processing module, comprising:

sub-dividing several consecutive read periods, in each of which a test square-wave signal is received, the test square-wave signal defining a length of the read periods, in a same fashion into a fixed number of elementary time intervals defined by a difference between a frequency of the read period and a frequency according to which a bit edge detection is timed;

identifying from the elementary time intervals a first elementary time interval in the read period which is earlier than an edge transition of the received test square-wave signal;

starting from said first elementary time interval, selecting a time window comprising several successive elementary time intervals, said time window being shorter than the read period;

over successive read periods, counting a number of times where a certain bit value is detected during each elementary time interval situated within the time window, said counting performed only for elementary time intervals within the time window; and generating an output which characterizes a statistical distribution of the bit value detections within the read period based on the number counted in each elementary time interval.

23. The method of claim 22 wherein selecting a time window comprises selecting a plurality of consecutive time windows within the read period, a first one of those time windows starting from the first elementary time interval, each time window including a same number of elementary time intervals.

24. The method according to claim 22, wherein generating comprises evaluating a mean value of the detection time within each read period.

25. The method according to claim 22, wherein generating comprises evaluating a standard deviation of the detection time within each read period.

* * * * *